United States Patent [19]
Thomas et al.

[11] Patent Number: 6,060,129
[45] Date of Patent: May 9, 2000

[54] METHOD FOR BULK COATING USING A PLASMA PROCESS

[75] Inventors: H. Ronald Thomas, Carneys Point, N.J.; Melissa A. Baylog, Easton; Victor M. Zeeman, Jr., Bangor, both of Pa.

[73] Assignee: Polar Materials, Inc., Pennsville, N.J.

[21] Appl. No.: 08/810,544

[22] Filed: Mar. 3, 1997

Related U.S. Application Data

[60] Provisional application No. 60/012,778, Mar. 4, 1996.

[51] Int. Cl.$^7$ .................. C08J 7/18; A05H 1/24; C23C 14/00
[52] U.S. Cl. .................. 427/490; 427/491; 427/569; 427/242; 204/192.14; 204/192.22; 204/192.15
[58] Field of Search .................. 427/569, 242, 427/490, 576, 491; 204/192.22, 192.14, 192.15

[56] References Cited

U.S. PATENT DOCUMENTS

| | | |
|---|---|---|
| 2,846,971 | 8/1958 | Baer et al. . |
| 3,395,674 | 8/1968 | Burnham et al. . |
| 3,514,388 | 5/1970 | Brumfield et al. .................. 427/534 |
| 3,562,140 | 2/1971 | Skinner et al. . |
| 3,632,494 | 1/1972 | Herte et al. . |
| 4,116,161 | 9/1978 | Steube . |
| 4,188,426 | 2/1980 | Auerbach . |
| 4,397,885 | 8/1983 | Akai et al. .................. 427/242 |
| 4,508,606 | 4/1985 | Andrade et al. . |
| 4,693,799 | 9/1987 | Yanagihara et al. . |
| 4,767,414 | 8/1988 | Williams et al. . |
| 4,822,632 | 4/1989 | Williams et al. . |
| 4,842,889 | 6/1989 | Hu et al. . |
| 4,844,986 | 7/1989 | Karakelle et al. . |
| 4,952,295 | 8/1990 | Kawabata et al. . |
| 4,988,421 | 1/1991 | Drawl et al. . |
| 4,992,153 | 2/1991 | Bergmann et al. . |
| 5,252,365 | 10/1993 | White . |
| 5,320,877 | 6/1994 | Nakaue et al. .................. 427/523 |
| 5,346,600 | 9/1994 | Nieh et al. . |
| 5,384,021 | 1/1995 | Thwaites . |
| 5,421,979 | 6/1995 | Stevenson . |
| 5,423,970 | 6/1995 | Kügler . |
| 5,464,518 | 11/1995 | Sieck et al. . |
| 5,466,296 | 11/1995 | Misiano et al. . |
| 5,470,388 | 11/1995 | Goedicke et al. .................. 118/716 |
| 5,527,439 | 6/1996 | Sieck et al. . |

*Primary Examiner*—Marianne Padgett
*Attorney, Agent, or Firm*—Lerner, David, Littenberg, Krumholz & Mentlik, LLP

[57] ABSTRACT

Objects such as pharmaceutical vial stoppers are coated by treating with material such as a fluoropolymer. The objects to be coated are mixed with pieces of the treating material, and the resulting pile is tumbled in a reaction vessel containing a plasma. The treating material is transferred from the pieces onto the objects to be coated.

18 Claims, 2 Drawing Sheets

METHOD FOR BULK COATING USING A PLASMA PROCESS

The present application claims the benefit of U.S. Provisional Application, Ser. No. 60/012,778 filed Mar. 4, 1996, the disclosure of which is hereby incorporated by reference herein.

FIELD OF THE INVENTION

The present invention relates to the field of deposition coating of three dimensional objects. More specifically, the invention relates to a process wherein a surface treating material is transferred onto the surfaces of a plurality of three dimensional objects simultaneously.

BACKGROUND OF THE INVENTION

Sputtering processes are used to apply a thin coating of a target material onto a substrate. Known sputtering processes typically take place in a partially evacuated chamber containing a small amount of ionizable gas such as argon. The gas is ionized by electromagnetic activation to form a plasma. A target material introduced into the chamber is bombarded by ions of the plasma, which imparts sufficient energy to eject atoms or molecules of the target material, which are then deposited onto the parts to be coated, i.e., the substrate.

Because the ejected atoms or molecules from the target material travel in a straight line, it is necessary to make special provisions for the coating of three dimensional objects having surfaces facing in more than one direction. It is known, for example, to move the parts to be coated while holding the target material stationary, thereby varying the "line of sight" from the target material to the substrate. U.S. Pat. No. 5,470,388 to Goedicke et al. discloses an apparatus for chemical vapor deposition or sputtering in which the parts to be coated are rotated in a drum at sufficient speed to press the parts against the wall of the drum by centrifugal force. A stripping device causes the parts to separate from the wall, fall downward by gravity, and rejoin the wall in a different position. The target material is held stationary within the rotating drum.

In U.S. Pat. No. 3,395,674 to Burnham et al., irregularly shaped parts are tumbled in a drum for coating in a vapor deposition process. The coating material is held stationary in an evaporator near the center of rotation of the drum.

The tumbling of parts has also been used in a chemical vapor deposition process wherein the coating material is introduced into the chamber in gaseous form. For example, a method and apparatus for making coated elastomeric closures by polymerizing a lower alkene with a plasma is disclosed in commonly assigned U.S. patent application Ser. No. 08/333,129 filed Nov. 1, 1994, which is hereby incorporated by reference in its entirety herein. That process uses a hollow tubular cylindrical reaction vessel for tumbling elastomeric closures in a low pressure environment. A gas is introduced containing a lower alkene such as propylene, as well as an inert gas such as helium or argon. Electromagnetic energy is applied to the vessel, causing a glow discharge in the interstices around the closures. The lower alkene is thereby deposited on the closures.

It is also known to mount the parts to be coated on a turntable or other means to present them at varying angles with respect to the target material. For example, in U.S. Pat. No. 4,952,295 to Kawabata et al., a turntable is placed in an evacuated chamber for rotation at relatively high speeds. The articles to be coated are arranged around the periphery of the turntable. Several pieces of target material are placed in positions near the turntable, and remain stationary with respect to the turntable. Several different target materials may be used in order to apply alternating layers on the articles.

One problem commonly encountered with such arrangements is that the target material coats not only the parts but also the walls and other elements within the chamber that are in a "line-of-sight" path with the target material. This secondary material transfer may consume a significant amount of target material, and necessitates a rigorous maintenance schedule in order to keep the functional parts within the evacuated chamber relatively free from the coating material.

As an alternative to moving the part to be coated with respect to the target material, it is also known to move the target material with respect to the part to be coated. A typical arrangement is disclosed in U.S. Pat. No. 5,527,439 to Sieck et al., wherein a cylindrical piece of target material is rotated with respect to an arrangement of permanent magnets that localize the plasma along a sputtering zone of the target. Material is ejected from the moving target surface onto a stationary substrate within the chamber. While this process may be used efficiently in the coating of flat objects such as silicon wafers, it does not lend itself to coating three-dimensional objects due to the "line-of-sight" problem discussed above.

Thus, there is a need for a bulk production coating apparatus that is capable of evenly and efficiently coating a quantity of three-dimensional objects. Despite considerable effort expended by those in the art, there has remained a significant, unmet need for an improved method for the bulk coating of three dimensional objects.

SUMMARY OF THE INVENTION

The present invention addresses these needs.

One aspect of the present invention provides a method for applying a surface treatment to a plurality of three dimensional objects. The method includes the steps of providing a pile of such objects within a reaction vessel so that there are interstices between the objects in the pile. At the same time, a treating material is provided in intimate contact with the pile. A plasma is formed in the interstices so that the treating material is transferred onto the objects. The plasma may be formed in the interstices so that a glow discharge is present in at least some of the interstices.

The method may further include agitating the pile of objects during the plasma forming step. In such an embodiment, the treating material may be provided in the form of solid pieces separate from the objects. The solid pieces of treating material may be disposed within the pile so that the pieces of treating material are moved within the pile into proximity with different objects by the agitation. The inventors have found that molecules ejected from the treating material by the plasma are more likely to adhere to an object to be coated as opposed to being deposited on another piece of treating material or the coating apparatus itself. After these steps, the pieces of treating material may be separated from the objects.

In another aspect of the invention, the step of providing treating material includes the step of providing the material fixed within the reaction vessel so that different portions of the pile of objects are brought into proximity with the pieces of treating material by the agitation. In this embodiment, the treating material may be provided as a layer on the interior of the reaction vessel.

In another aspect of the invention, the treating material is provided on a portion of each of the objects, whereby the treating material on each of the objects will be disposed in proximity to portions of other objects in the pile.

The agitating step may include the step of rotating the reaction vessel about a generally horizontal rotation axis in order to tumble the pile of objects. In addition, the reaction vessel may be pivoted about a generally horizontal pivot axis transverse to the axis of rotation in order to further tumble the pile of objects.

The treating material of the process may be a polymer, wherein each of the objects is coated with the polymer. The polymer may be a fluoropolymer such as a polymer consisting essentially of PTFE (polytetraflourethylene). The objects to be coated may include an elastomer at an exposed surface of the object, wherein the elastomer is coated by the polymer. The object, may, for example, be elastomeric closures.

The plasma of the process may be formed by supplying an inert gas to the reaction vessel and converting the inert gas to a plasma. The inert gas may consist essentially of argon.

Further aspects of the present invention provide coated elastomeric closures. As used herein, the term "elastomeric closures" refers to elastomeric elements such as plugs, stoppers, "o" rings, and other elements which can be used to provide fluid-tight seals. Most desirably, the coated closures are made in accordance with the processes as aforesaid. The coated closures desirably include an elastomeric body, such as a body consisting essentially of rubber and defining a sealing surface, at least the sealing surface being coated by a fluoropolymer such as PTFE, FEP, PFA or ETFE.

DETAILED DESCRIPTION OF THE PREFERRED EMBODIMENT

Figure 1:
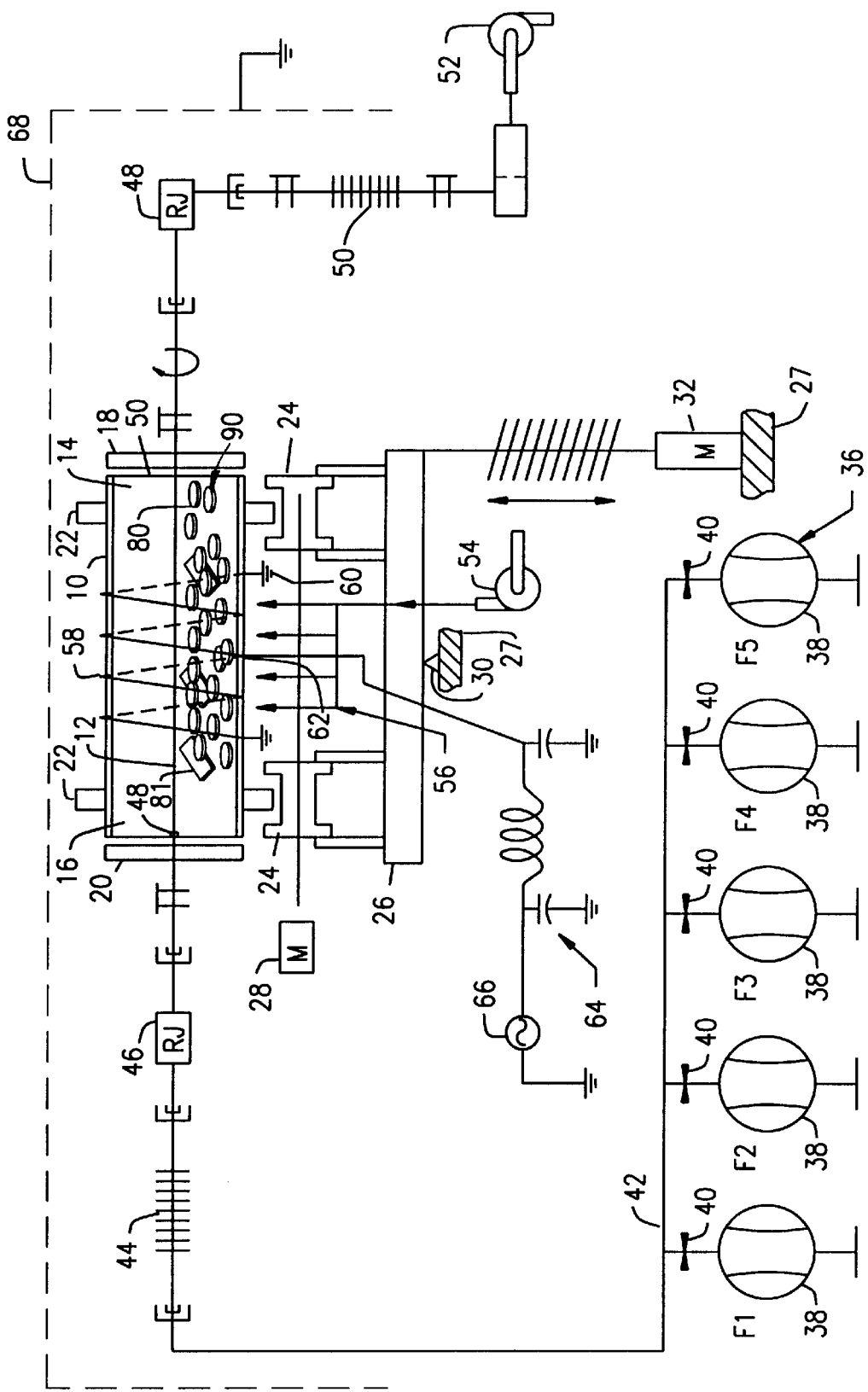
FIG. 1 is a diagrammatic view of apparatus in accordance with one embodiment of the invention.

Apparatus for use in one embodiment of the method of the present invention is illustrated in FIG. 1. The apparatus includes a hollow, tubular cylindrical reaction vessel 10 formed from glass, the reaction vessel having a central axis 12. The inlet and outlet ends 16 and 14 of the reaction vessel are closed by end panels 20 and 18 respectively. The end panels are arranged so that the same can be readily detached from the reaction vessel and reattached thereto to permit access to the interior of the reaction vessel. The end panels of the reaction vessel are equipped with conventional seals (not shown). Reaction vessel 10 is mounted in circular journals 22. Journals 22 rest on rollers 24, which in turn are supported for rotation on a frame 26. Rollers 24 are connected to a rotation drive motor 28 so that motor 28 can drive the rollers and rotate vessel 10 around the central axis 12. Frame 26 in turn is pivotally mounted to a subframe 27 by a pivoted joint, schematically indicated at 30. A reciprocating linear actuator 32 is connected between the subframe 27 and a point on frame 26 remote from the pivot joint 30 so that the reciprocating actuator will cause the frame 26 to rock, relative to subframe 27, around a pivot axis passing through pivot joint 30. The pivot axis is transverse to the axis 12 of the reaction vessel; as seen in FIG. 1, the pivot axis extends into and out of the plane of the drawing through pivot joint 30.

Gas supply apparatus 36 includes a plurality of gas sources 38 each connected by a valve 40 to a manifold 42. The gas sources themselves may include conventional elements such as storage tanks containing the desired gases, pressure regulators, flow meters, safety valves, purge valves and the like. As further discussed below, some or all of the gas sources may be actuated together so as to supply a gas mixture containing the required components. Manifold 42 is connected through a flexible bellows 44 and a rotary joint 46 to an inlet port 48 in end panel 20, at the inlet end of vessel 10. An outlet port 50 in end panel 18 at the outlet end 14 of the vessel is connected through a similar rotary joint 48 and flexible bellows 50 to an exhaust system 52 which includes a vacuum pump and conventional auxiliary equipment. The gas supply systems and exhaust systems also include conventional control elements such as pressure, temperature and flow rate sensors, programmable controllers and the like. These elements are also linked to conventional control elements (not shown) arranged to control the operation of motor 28 and linear actuator 32. A blower 54 is connected to a cooling air manifold 56 disposed adjacent the exterior of vessel 10. The cooling air manifold may, for example, be mounted on frame 26.

A plasma forming means 58 may include a helical metallic coil electrode encircling vessel 10, the coil being spaced slightly outside of the exterior of the vessel. The coil is fixed to frame 26, and does not rotate with the vessel. The ends 60 of the coil are electrically connected to ground potential, whereas a center tap 62 at the middle of the coil is electrically connected to the output of an impedance matching network 64. The input of network 64 is connected to a conventional radio frequency generator 66. The impedance matching network may be of conventional construction and may include elements such as variable capacitors and/or inductors. As is conventional in the RF plasma art, the impedance matching network is adjusted for efficient power transfer between the RF generator and the coil, and between the coil and the plasma as discussed below.

The RF generator 66 can be arranged to operate at any suitable frequency, typically between about 100 KHz and about 300 MHz. However, the generator preferably is set to operate at a so-called "ISM" or industrial-scientific-medical frequency as required by radio communications authorities. 13.56 MHz is a particularly preferred ISM frequency. Vessel 10 and coil 58 are surrounded by a grounded metallic shield 68, only partially illustrated in FIG. 1. The shield may be provided with appropriate openable access panels (not shown) for access to the end panels 18 and 20 on the vessel.

In an alternative embodiment, the plasma forming means may include a clam-shell-type electrode (not shown) mounted to the frame 26 in close proximity to the vessel 10. RF power is applied to the gas within the chamber in a manner analogous to that described for a coil.

Figure 2:
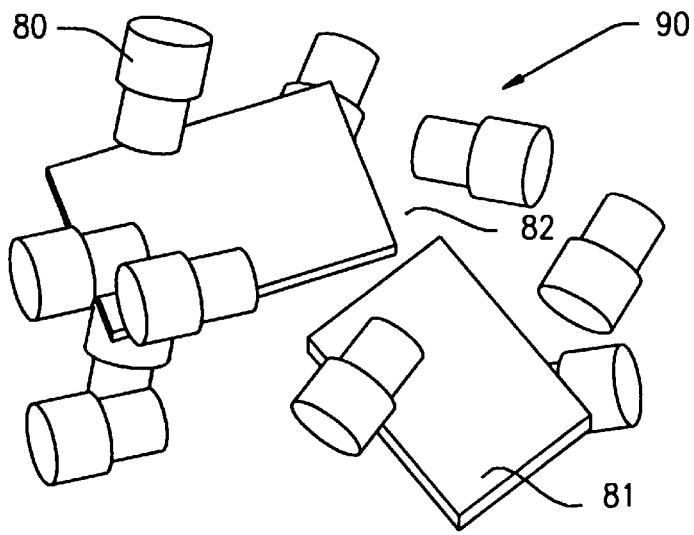
FIG. 2 is a partial diagrammatic view of a pile of objects to be coated, together with pieces of treating material according to one embodiment of the method of the invention.
Figure 5:
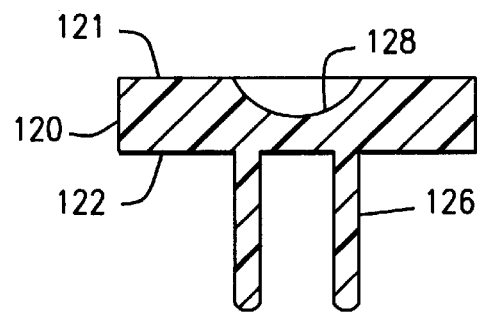
FIG. 5 is a sectional view of a closure that is coated in one embodiment of the invention.

In a method according to one embodiment of the invention, uncoated objects 80 are mixed with pieces of treating material 81 so that the objects and the pieces of treating material are in intimate contact (FIG. 2). The term "intimate contact" as used herein means that all of the uncoated objects and all the pieces of treating material cooperatively define more than one physical contact point between objects and coating material pieces, although the contact points themselves may change during the process. The uncoated objects may be closures which can be used to provide a fluid type seal, such as for sealing pharmaceutical vials and other containers. As illustrated in FIG. 5, a typical closure includes a relatively thick ring portion 120 defining a top surface 121 and a bottom surface 122, a hollow cylindrical protrusion 126 extending from the bottom surface and a relatively thin puncturable diaphragm or septum 128 aligned with the interior of the hollow cylindrical protrusion.

Closures such as stoppers typically are formed from rubber compositions including polymers such as butyl rubber, natural and synthetic polyisoprene, silicones and combinations of these together with vulcanizing or crosslinking agents, catalysts, retarders, pigments and the like. The rubber composition may also include particulate fillers such as carbon black and others. Alternatively, the closures may be formed from non-rubber elastomers such as thermoplastic and thermosetting polyurethanes, and other synthetic polymers having elastomer properties. These materials may also be blended with additives and fillers. Accordingly, as used herein, the term "elastomer" refers to any composition having elastomeric properties, regardless of whether the same includes rubbers or other polymers.

The pieces of treating material 81 are interspersed randomly among the objects 80 to be coated. In a preferred process of the invention, the treating material is PTFE (polytetrafluorethylene) Teflon, although other materials may be used. For example, other types of fluoropolymers such as FEP (fluorinated ethylene-propylene) Teflon, PFA (perfluoroalkoxy) Teflon, and ETFE (ethylene tetrafluorethylene copolymer) Tefzel may be used to yield different combinations of friction and barrier properties on the coated objects. The pieces of treating material may be larger than, comparable in size to, or smaller than the objects to be coated. The pieces may be a predetermined shape, such as disc shaped or prismatic, or may be randomly shaped, granular, or in powder form.

In the preferred process of the invention, pieces of PTFE Teflon are intermixed with the closures to be coated as shown in FIG. 2, forming a pile 90 of objects 80 and treating material 81 in intimate contact. In the resulting pile 90, interstices 82 are defined by the objects and pieces of treating material. The shapes and sizes of the interstices depend upon the shapes and sizes of the objects to be coated and of the pieces of treating material, and upon the random arrangement of those components within the pile.

The objects to be coated and the pieces of treating material are introduced into the vessel 10 by opening end panel 20 and resealing the end panel. The pile may be premixed before introducing into the chamber, or the objects to be coated may be introduced into the vessel separately from the pieces of treating material, to be later mixed by the action of the vessel 10 as described below.

After sealing the chamber, exhaust system 52 (FIG. 1) is actuated to bring the chamber to a subatmospheric pressure, preferably between about 0.01 and 10 Torr, and more preferably between about 0.1 and 1 Torr. The desired results have been achieved using the above-described chamber at about 170 milliTorr. Gas supply unit 36 is actuated to provide an inert gas, preferably argon. The gas enters the chamber through inlet 48 at the inlet end 16 and passes downstream, in directions generally parallel to the axis 12 to the outlet 50. As exhaust system 52 and gas supply device 36 continue to operate, the space within the vessel 10, including the interstices 82 in the pile, is gradually purged of air and filled entirely with the gas at the aforementioned subatmospheric pressure. The flow rate of the gas mixture desirably is between about 0.2 and about 0.8 standard cubic centimeters per minute per each liter of volume in the interior of the chamber 10 (including the volume occupied by closures). For the chamber described above, a flow rate of approximately 50 standard cubic centimeters per minute of the inert gas has been found to achieve the desired result.

Drive motor 28 is actuated to rotate vessel 10 about axis 12, causing the pile 90 to continually tumble and rearrange itself, thereby also causing the pieces of treating material 81 and the objects 80 to change in relative positions while remaining in intimate contact, continually causing new interstices 82 to form within the pile. At the same time linear actuator 32 rocks frame 26, and hence vessel 10, about pivot axis 30. This causes the objects 80 and pieces 81 to continually move back and forth between the ends of the chamber, in upstream and downstream directions parallel to the axis of the chamber. Thus, the pile 90 will continually travel between an upstream region adjacent inlet end 16 and a downstream region adjacent outlet end 14. The optimum rotational speed, rocking movement rate and degree of rocking movement will vary with the diameter of the vessel, the number of objects and pieces of treating material, the type of objects, the shape and size of the pieces of treating material and the degree of circulating movement desired. However, for typical conditions a rotation rate of between about 1 and about 5 revolutions per minute, a rocking motion of frame 26 encompassing about 20 degrees of arc and a rocking rate of about 1 to about 3 cycles per minute are satisfactory.

Power supply 66 is actuated to apply radio frequency excitation to the plasma forming means 58. This in turn applies electric fields through the wall of vessel 10 to the gas within the vessel. The applied electric field creates a glow discharge and forms a low-temperature plasma within the vessel. As used herein, the term "low-temperature plasma" refers to a plasma in which the temperature of the atoms and positively charged ions is relatively low, and substantially below the electron temperature of the plasma. Preferably, the temperature of the atoms and ions in the plasma is less than about 100° C. and more desirably less than about 40° C. and most preferably at about room temperature, i.e., at about 20–25° C. The temperature of the objects to be coated desirably is in the same range. The energy applied through plasma forming means 58 tends to heat the vessel and its contents. Cooling air supplied by fan 54 blows over the outside of the vessel and carries off this heat.

The glow discharge occurs principally within the interstices 82 among the objects 80 and the pieces of treating material 81. It is desirable to conduct the process at a moderate rate to achieve a uniform coating at a controllable thickness. The glow discharge in the interstices provides a useful indicator of the process rate and other process characteristics. The glow discharge may be monitored with optical sensors or visually. Under normal conditions, when the process is being conducted at the desired, moderate rate, the glow discharge fills about one-fourth to about three-fourths of the interstices, as measured by visual observation.

As the process continues, a coating of the treating material builds up on the surfaces of the closures. Although the present invention is not limited to any theory of operation, it is believed that the energetic ions of the plasma formed from the gas mixture bombard the surfaces of the pieces of treating material 81, transferring energy to molecules of treating material. Material is thereby separated and ejected from the surfaces of the pieces, and deposited on the objects to be coated. The process is continued until the thickness of the deposited material is at the desired level. The chamber is then returned to atmospheric pressure and the objects and pieces of treating material are removed from the chamber and separated. The process permits the efficient, uniform, bulk deposition of a coating material onto three-dimensional objects. The pieces of treating material create multiple small material sources within the pile of objects to be coated. The intimate contact of the target material with the surfaces of the objects results in efficient use of this target material. Deposition onto the walls of the vacuum chamber is reduced since the multiple treating material sources are usually buried in the tumbling pile of objects, minimizing "line-of-sight" paths between the pieces of treating material and the walls of the vacuum chamber. If some of the treating material should deposit on the chamber walls, it is eventually redeposited elsewhere since the plasma fills the entire vacuum chamber. Tumbling the mixture results in uniform coating of the objects by continually exposing new surfaces of the objects to treating material sources.

The method of the invention provides significant advantages over the prior art methods of coating three dimensional objects. Most prior art methods use a fixed source of target material located some distance away from the objects to be coated. Such an arrangement results in a significant portion of the ejected material from the target source striking the vessel walls rather than being deposited on the objects to be coated. In contrast, intimate contact between the pieces of treating material and the objects to be coated in the present invention results in a large percentage of the ejected material striking the objects to be coated.

As the process progresses, it is believed that material that has already been deposited onto the objects to be coated may again be ejected by the plasma. Contrary to normal sputtering practice, the objects 80 to be treated are exposed to essentially the same conditions as the coating source material pieces 81. Conventional sputtering theory would suggest that little or no net deposition occurs. The inventors have observed, however, that the thickness of Teflon coating on elastomeric closures continues to increase as the process progresses, indicating a greater rate of deposition onto the elastomeric closures than the rate of resputtering from the closures.

Figure 3:
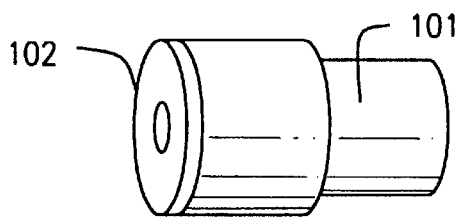
FIG. 3 is diagrammatic view of an object to be coated according to another embodiment of the method of the invention.

In another embodiment of the invention, separate pieces of treating material are not provided in the pile of objects to be coated. Instead, a layer or laminate 102 of treating material is provided on some surfaces of at least some of the objects 101 to be coated, as shown in FIG. 3. The layer 102 may be laminated or coated onto the object 101, and is generally thicker than the desired coating thickness. The lamination 102 of treating material remains in intimate contact with the objects to be coated and acts as a treating material source when exposed to the plasma within the chamber 10. The process is continued until the lamination 102 has been transferred to form a coating on the other surfaces of the treated objects. In this embodiment, it is not necessary to separate the pieces of treating material 81 from the objects 80, as is necessary in the embodiment of FIG. 2.

Figure 4:
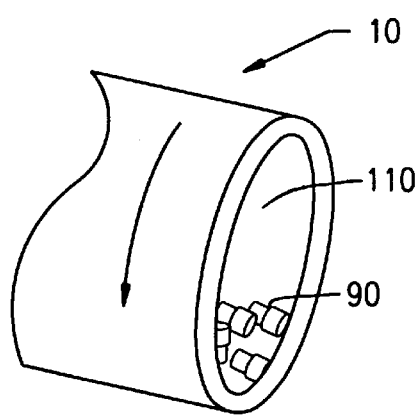
FIG. 4 is a diagrammatic view of a portion of a rotating chamber according to one embodiment of the invention.

In yet another embodiment of the invention, the rotating chamber 10 may be lined with a sheet of treating material 110, as shown in FIG. 4. The material 110 should be a dielectric material to allow an electric field to pass through the chamber. The sheet 110 remains in intimate contact with the objects during the process and provides a treating material source for coating the pile of objects 90. By lining the chamber 10 with the treating material sheet 110, it is not necessary to separate pieces of treating material from the objects after the process is complete, and the deposition of treating material onto to the walls of the chamber 10 is of no consequence.

The net result of the process is the transfer of physical properties exhibited by the coating material onto the substrate. In addition to fluoropolymers, other polymers may be used as coating materials including chloropolymers, fluorochloropolymers and other halopolymers, vinyl alcohol polymers, cyclic olefin polymers, polyolefins such as polyethylene and polypropylene, polyamides and polyesters. Other classes of materials such as metals may also be substituted to yield other types of coatings such as metalization. Further, the closures may be plasma pretreated to promote adhesion of the coating, or plasma postreated to modify the final surface properties. While the embodiment described results in a coating that is beneficial mainly for its low friction properties, the process of the invention is also suitable for applying other coatings such as oxygen barrier coatings, water vapor barrier coatings and chemical migration barrier coatings.

The following non-limiting example illustrates certain features of the invention:

EXAMPLE 1 a batch of 1,000 standard 20 mm size elastomeric pharmaceutical closures of the type commonly referred to as vial stoppers are loaded into a reactor vessel as illustrated in FIG. 1, having an interior diameter of about 30 cm and an axial length of about 1 meter. Twelve pieces of PTFE Teflon, each approximately 3 inches by 1 inch by $\frac{1}{16}$th inch are also introduced into the reactor vessel. The vessel is rotated about its axis at about 2 RPM, but is not rocked about a pivot axis. The chamber is evacuated and argon gas is introduced at 50 SCCM (standard cubic centimeters per minute) and the pressure is controlled at 170 milliTorr. RF excitation of 300 watts at 13.56 MHz is applied using a clam shell electrode. The coating process is run for 60 minutes, after which the stoppers and the pieces of Teflon are removed and separated.

The unprocessed pharmaceutical closure had an initial static coefficient of friction of 65 degrees, as measured as the angle of first slip on a motorized inclined fixture supporting the closure on two smooth steel rails contacting the bottom surface 122 of the ring portion 120. Such a friction measurement is described in U.S. patent application Ser. No. 08/333,129. After undergoing the process of the example, the same closure has a static coefficient of friction of 32 degrees, indicating that the closure has been coated with PTFE.

Numerous variations and combinations of the features discussed above can be used without departing from the present invention as defined by the claims. Merely by way of example, the plasma can be excited by energy other than radio frequency energy. Microwave excitation may be employed using known forms of microwave energy applicators; audio frequency may also be used. Also, although the tumbling and pivoting reaction vessel discussed above is particularly advantageous, the reaction can be conducted in vessels agitated by other means, such as vibratory or purely rocking means or by internal moving agitators. Also, the process may be performed in a continuous fashion along with continuous input and output of objects to be coated and pieces of treating material to and from the reaction vessel where the vessel is appropriately equipped. While a low-pressure environment is currently preferred, atmospheric or other pressures may also be used and still practice the invention. As these and other variations and combinations of the features discussed above can be utilized without departing from the invention as defined by the claims, the foregoing description of the preferred embodiment should be taken by way of illustration rather than by way of limitation of the claimed invention.

What is claimed is:

1. A method of applying a surface treatment to a plurality of objects including steps of:
   providing a pile of the objects within a reaction vessel so that there are interstices within the pile between the objects while
   providing a solid treating material in intimate contact with the pile, and
   forming a plasma at least in said interstices so that the treating material is transferred onto the objects.

2. A method as claimed in claim 1 wherein said step of forming a plasma in said interstices is performed so that a low temperature plasma is formed and a glow discharge is present in at least some of said interstices.

3. A method as claimed in claim 1 further comprising a step of agitating said pile of the objects during said plasma-forming step.

4. A method as claimed in claim 1 or claim 3 wherein:
   each said object has a first portion and a second portion; and
   said step of providing said treating material includes a step of providing a layer of said treating material on said first portion of each said object before forming said pile in said reaction vessel, so that said treating material on said first portion will be disposed in proximity to said second portion of at least one other object in the pile, whereby said layer of treating material acts as a source of treating material when exposed to said plasma.

5. A method as claimed in claim 3 wherein said step of agitating said pile includes a step of rotating said reaction vessel about a generally horizontal rotation axis to tumble said pile.

6. A method as claimed in claim 3 wherein said step of providing said treating material includes a step of providing said treating material in the form of solid pieces of said treating material separate from said objects.

7. A method as claimed in claim 6 wherein said pieces of said treating material are disposed within said pile so that each of said pieces of said treating material are moved from proximity with some of said objects within said pile into proximity with others of said objects by said agitation.

8. A method as claimed in claim 7 further comprising a step of separating said pieces of said treating material from the Rile of said objects after said plasma-forming and agitating steps.

9. A method as claimed in claim 6 wherein said step of providing the treating material includes a step of providing said treating material fixed within said reaction vessel so that different portions of said pile are brought into proximity with said pieces of said treating material by said agitation.

10. A method as claimed in claim 9 wherein said treating material is provided as a layer on the interior of said reaction vessel.

11. A method as claimed in claim 10 wherein said step of agitating said pile includes;
    a step of rotating said reaction vessel about a generally horizontal rotation axis to tumble said pile; and
    a step of pivoting said reaction vessel about a generally horizontal pivot axis transverse to said rotation axis to further tumble said pile.

12. A method as claimed in claim 1 wherein said re material is a polymer and wherein each said object is coated with said polymer.

13. A method as claimed in claim 12 wherein said polymer includes a fluoropolymer.

14. A method as claimed in claim 13 wherein said polymer consists essentially of poltertraflourethylene (PTFE).

15. A method as claimed in claim 12, claim 13 or claim 14 wherein said objects include an elastomer at an exposed surface of said object, and wherein said elastomer is coated by said polymer.

16. A method as claimed in claim 15 wherein said objects are elastomeric closures.

17. A method as claimed in claim 1 wherein said step of forming a plasma includes steps of supplying an inert gas to said reaction vessel and converting the inert gas to a plasma.

18. A method as claimed in claim 17 wherein said inert gas consists essentially of argon.

* * * * *

UNITED STATES PATENT AND TRADEMARK OFFICE
CERTIFICATE OF CORRECTION

| | | |
|---|---|---|
| PATENT NO. | : | 6,060,129 |
| DATED | : | May 9, 2000 |
| INVENTOR(S) | : | Thomas et al. |

It is certified that error appears in the above-identified patent and that said Letters Patent is hereby corrected as shown below:

Col. 8, line 29, after "EXAMPLE 1" insert --:--.

Col. 10, line 8, "Rile" should read --pile--.

Col. 10, line 27, "re" should read --treating--.

Col. 10, line 33, "poltertraflouretheyene" should read --polytetraflourethylene--.

Signed and Sealed this

Twenty-fourth Day of April, 2001

Attest:

NICHOLAS P. GODICI

Attesting Officer

Acting Director of the United States Patent and Trademark Office